(12) United States Patent
Yamashita et al.

(10) Patent No.: US 10,069,056 B2
(45) Date of Patent: Sep. 4, 2018

(54) LIGHT EMITTING DEVICE

(71) Applicant: NICHIA CORPORATION, Anan-shi (JP)

(72) Inventors: Ryohei Yamashita, Tokushima (JP); Shimpei Sasaoka, Itano-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/726,383

(22) Filed: Oct. 6, 2017

(65) Prior Publication Data

US 2018/0040791 A1 Feb. 8, 2018

Related U.S. Application Data

(63) Continuation of application No. 15/417,226, filed on Jan. 27, 2017, now Pat. No. 9,812,627.

(30) Foreign Application Priority Data

Jan. 27, 2016 (JP) .................................. 2016-012956

(51) Int. Cl.
*H01L 29/26* (2006.01)
*H01L 33/62* (2010.01)
*H01L 33/54* (2010.01)

(52) U.S. Cl.
CPC .............. *H01L 33/62* (2013.01); *H01L 33/54* (2013.01)

(58) Field of Classification Search
None
See application file for complete search history.

(56) References Cited

U.S. PATENT DOCUMENTS

| 9,812,627 | B2* | 11/2017 | Yamashita | .............. H01L 33/54 |
| 2005/0056855 | A1 | 3/2005 | Lin et al. | |
| 2009/0050925 | A1 | 2/2009 | Kuramoto et al. | |
| 2010/0025709 | A1 | 2/2010 | Koseki et al. | |
| 2012/0181561 | A1 | 7/2012 | Fujimori et al. | |
| 2013/0221509 | A1 | 8/2013 | Oda et al. | |
| 2013/0277696 | A1 | 10/2013 | Matsui et al. | |
| 2014/0191268 | A1 | 7/2014 | Ebisawa et al. | |
| 2015/0048390 | A1 | 2/2015 | Imazu et al. | |
| 2017/0213944 | A1* | 7/2017 | Naka | ....................... H01L 33/62 |

FOREIGN PATENT DOCUMENTS

| JP | 11-121797 | 4/1999 |
| JP | 2001-223391 | 8/2001 |
| JP | 2002-118293 | 4/2002 |
| JP | 2003-007929 | 1/2003 |
| JP | 2004-356129 | 12/2004 |
| JP | 2005-093970 | 4/2005 |

(Continued)

OTHER PUBLICATIONS

Notice of Allowance with Form PTO-892 Notice of References Cited issued by the U.S. Patent and Trademark Office for the U.S. Appl. No. 15/417,226, dated Jul. 6, 2017.

*Primary Examiner* — Jack Chen
(74) *Attorney, Agent, or Firm* — Mori & Ward, LLP

(57) ABSTRACT

A light emitting device includes a resin package and a light emitting element. The resin package includes a first lead, a second lead, and a molded body molded integrally with the first lead and the second lead. The light emitting element is provided on the resin package.

16 Claims, 4 Drawing Sheets

(56) References Cited

FOREIGN PATENT DOCUMENTS

| | | |
|---|---|---|
| JP | 2005-322722 | 11/2005 |
| JP | 2007-134376 | 5/2007 |
| JP | 2010-034292 | 2/2010 |
| JP | 2010-157638 | 7/2010 |
| JP | 2012-134421 | 7/2012 |
| JP | 2012-138499 | 7/2012 |
| JP | 2012-146926 | 8/2012 |
| JP | 2012-191233 | 10/2012 |
| JP | 2012-244086 | 12/2012 |
| JP | 2013-030524 | 2/2013 |
| JP | 2013-098202 | 5/2013 |
| JP | 2014-22607 | 2/2014 |
| JP | 2014-22608 | 2/2014 |
| JP | 2014-22609 | 2/2014 |
| JP | 2014-22610 | 2/2014 |
| JP | 2014-033113 | 2/2014 |
| JP | 2014-093509 | 5/2014 |
| JP | 2014-123588 | 7/2014 |
| JP | 2014-150245 | 8/2014 |
| JP | 2014-207267 | 10/2014 |
| JP | 2014-232781 | 12/2014 |
| JP | 2016-039321 | 3/2016 |
| WO | WO 2012/060336 | 5/2012 |
| WO | WO 2012/091042 | 7/2012 |
| WO | WO 2013/115379 | 8/2013 |
| WO | WO 2015/092781 | 6/2015 |

\* cited by examiner

LIGHT EMITTING DEVICE

CROSS-REFERENCE TO RELATED APPLICATIONS

The present application is a continuation application of the U.S. patent application Ser. No. 15/417,226 filed Jan. 27, 2017, which claims priority under 35 U.S.C. § 119 to Japanese Patent Application No. 2016-012956, filed Jan. 27, 2016. The contents of this application are incorporated herein by reference in their entirety.

BACKGROUND OF THE INVENTION

Field of the Invention

The present disclosure relates to a light emitting device.

Discussion of the Background

With a light emitting device including a light emitting element such as an LED, high light emission efficiency can be obtained, so that such a light emitting device is used in many devices such as a backlight for a display device and the like and a lighting device for illumination.

Japanese Unexamined Patent Application Publication No. 2010-34292 discloses a light emitting device that includes a resin package including positive and negative leads, and electronic components such as a light emitting element and a protective element that are disposed on the resin package. Japanese Unexamined Patent Application Publication No. 2010-34292 further discloses a configuration in which a light emitting element having a positive electrode and a negative electrode on the same surface side is flip-chip mounted on positive and negative leads.

SUMMARY OF THE INVENTION

According to one aspect of the present invention, a light emitting device includes a resin package and a light emitting element. The resin package includes a first lead, a second lead, and a molded body molded integrally with the first lead and the second lead. The light emitting element is provided on the resin package.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
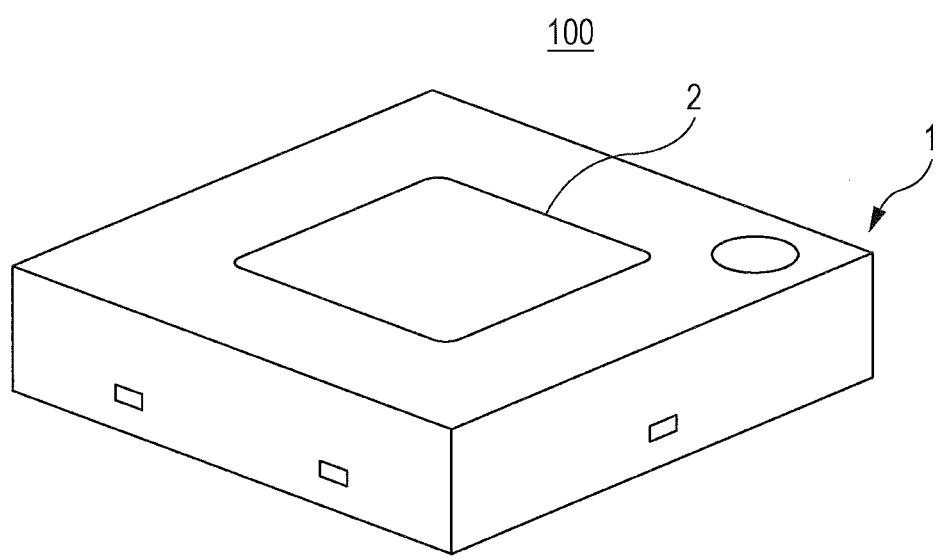
FIG. 1A is a schematic perspective view of a light emitting device according to a first embodiment of the present disclosure.

The embodiments will now be described with reference to the accompanying drawings, wherein like reference numerals designate corresponding or identical elements throughout the various drawings.

In the description below, certain embodiments according to the present disclosure are described with reference to drawings. The embodiments described below are intended as illustrative to give a concrete form to technical ideas of the present invention, and the scope of the invention is not limited to those described below. A configuration described in one embodiment can also be applied to another embodiment unless otherwise specified. In the description below, terms that indicate specific directions and positions (e.g., "upper," "lower," "right," "left," and other terms including these terms) are used as necessary, but those terms are used for easy understanding of the present invention with reference to the drawings, and thus the technical scope of the present disclosure shall not be limited by the meaning of those terms.

It is also to be noted that the size, positional relationship, and the like of members illustrated in the drawings may be exaggerated for the sake of clarity of description. Parts having the same reference numeral represented in a plurality of drawings indicate the same portion or the same member.

A light emitting device according to the present disclosure includes a resin package in which a molded body is molded integrally with a first lead and a second lead, a light emitting element mounted on the resin package, and first and second electrically-conductive bonding members that electrically connects the light emitting element to the first lead and the second lead, respectively. The light emitting element includes a first electrode and a second electrode, and the first electrode and the second electrode each include a post electrode with a thickness of 50 μm to 150 μm. The first electrode and the second electrode of the light emitting element are disposed to face the first lead and the second lead, respectively, and the light emitting element is mounted across the first lead and the second lead.

In the light emitting device having such a configuration, even when the leads are expanded or contracted by heat when a resin material for, for example, a sealing member is cured or when a bonding material that bonds the light emitting element is cured, with the electrodes of the light emitting element that include the post electrodes, stress applied on a bonding portion between the light emitting element and the leads can be effectively reduced. As a result, the light emitting element can be prevented from being detached from the leads. The light emitting element is flip-chip mounted on the positive and negative leads, which allows for omitting a region in which wire is disposed to reduce the size of the light emitting device, as compared with a light emitting device in which a light emitting element is electrically connected with wire. Further, with no wire, an opening (light emitting area) of the light emitting device can be reduced, so that an optical control by a secondary lens can be facilitated.

Hereinafter, light emitting devices according to certain embodiments of the present invention are described in detail.

First Embodiment

Figure 1B:
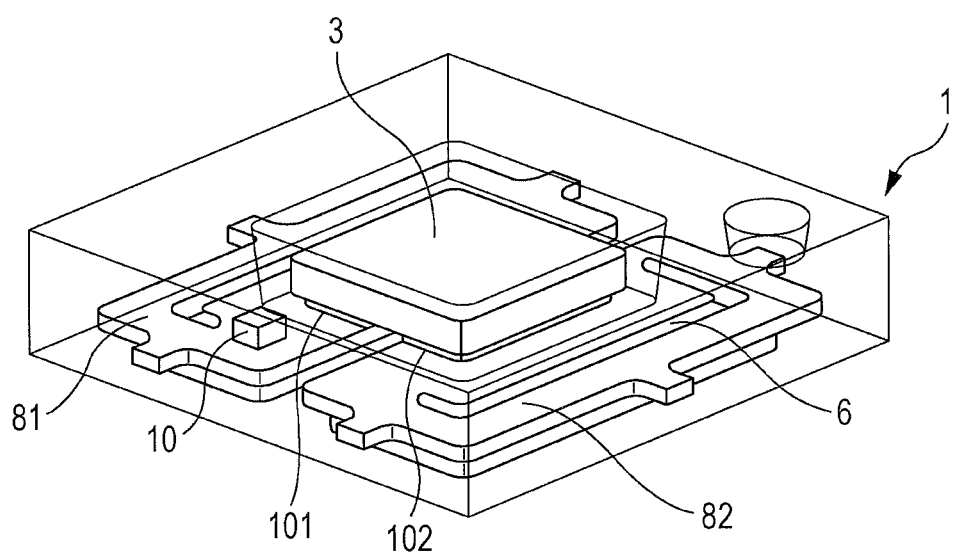
FIG. 1B is a schematic perspective transparent view of the light emitting device according to the first embodiment of the present disclosure.
Figure 1C:
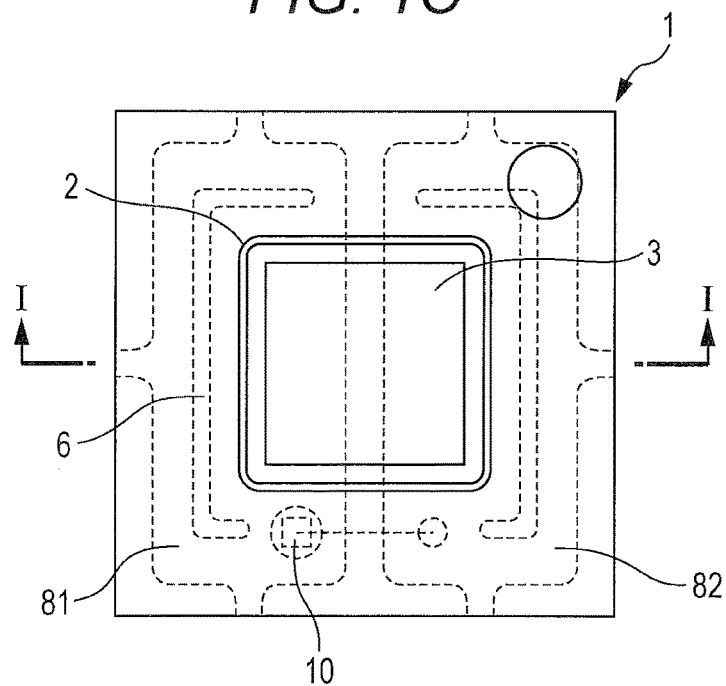
FIG. 1C is a schematic top transparent view of the light emitting device according to the first embodiment of the present disclosure.
Figure 1D:
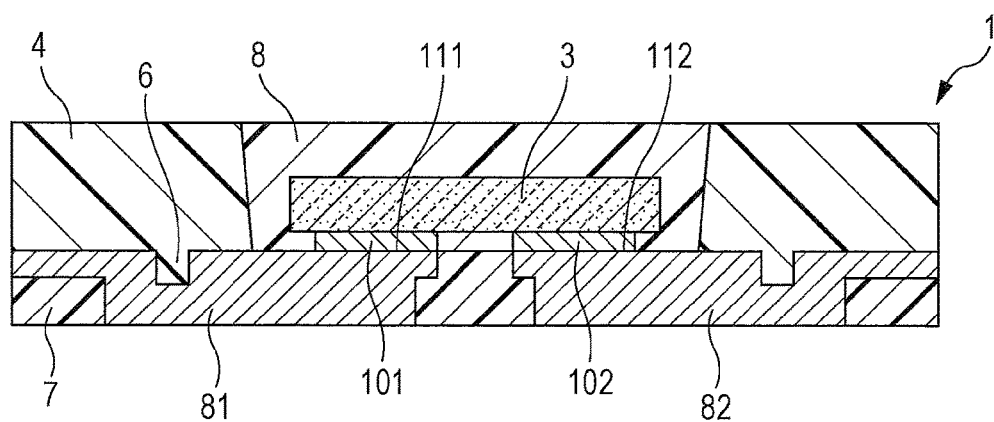
FIG. 1D is a schematic cross-sectional view taken along the line I-I in FIG. 1C.

FIG. 1A is a schematic perspective view showing a light emitting device 100, FIG. 1B is a schematic perspective transparent view showing the light emitting device 100, FIG. 1C is a schematic top transparent view showing the light emitting device 100, and FIG. 1D is a schematic cross-sectional view taken along the line I-I in FIG. 1C.

The light emitting device 100 includes a resin package 1 in which a molded body 7 is molded integrally with a first lead 81 and a second lead 82, a light emitting element 3 mounted on the resin package 1, a first electrically conductive bonding member 111 that electrically connects the light emitting element 3 to the first lead 81, and a second electrically conductive bonding member 112 that electrically connects the light emitting element 3 to the second lead 82.

Resin Package

As shown in FIGS. 1B and 1C, the resin package 1 includes the first lead 81 and the second lead 82 and the molded body 7 molded integrally with the first lead 81 and the second lead 82. In the light emitting device 100 shown in FIG. 1D, the resin package 1 includes lateral walls 4 surrounding the light emitting element 3, and a recess 2 is defined by an inner surface of each of the side walls 4 and a bottom surface including a portion of each of the first lead 81 and the second lead 82.

The outer shape of the resin package 1 is not limited to a substantially rectangular parallelepiped shape as shape of in FIG. 1A, but may be a substantially regular hexahedron, a substantially hexagonal column, or other polyhedron shapes. The resin package 1 may have, in a top view, a substantially triangular shape, a substantially tetragonal shape, a substantially pentagonal shape, a substantially hexagonal shape, or another polygonal shape.

The recess 2 may have, in a top view, a substantially circular shape, a substantially elliptical shape, and a substantially polygonal shape, for example. While a lateral surface of the recess 2 is preferably slanted outward from the bottom surface of the recess 2 toward an opening of the recess 2, the lateral surfaces of the recess 2 may be orthogonal from the bottom surface toward the opening. In particular, in the case where the lateral surfaces of the recess 2 is slanted outward from the bottom surface of the recess 2 toward the opening of the recess 2, light from the light emitting element 3 can be efficiently extracted in a direction toward the opening.

Each of the lateral walls 4 of the resin package 1 may have any appropriate width, but the width is preferably in a range of 100 μm to 1000 μm, and more preferably 600 μm to 800 μm. The distance between the each of the lateral walls 4 and respective one of lateral surfaces of the light emitting element 3 is preferably in a range of 50 μm to 100 μm. The expression "width of each of the lateral walls 4 of the resin package 1" refers to the width of an upper surface of each of the lateral walls 4, more specifically, the distance between an outer surface of each of the lateral walls in FIG. 1D and the opening of the recess 2. The expression "distance between each of the lateral walls 4 and respective one of lateral surfaces of the light emitting element 3" refers to the shortest distance between each of the lateral surfaces of the light emitting element 3 and an inner surface of respective one of the side walls 4. The ratio of the area of the outer shape of the resin package 1 in a top view to the area of a region where the lateral walls 4 are disposed in a top view is preferably 1:0.6 to 1:0.8.

The resin package 1 may have any appropriate height, but is preferably in a range of 500 μm to 600 μm. The ratio of the height of the resin package 1 to the thickness of each of the first lead 81 and the second lead 82 is preferably 1:0.3 to 1:0.4. The thickness of the first lead 81 refers to the distance between an upper surface and a lower surface of the first lead 81, more specifically, the thickness of the thickest portion of the first lead 81. The thickness of the second lead 82 refers to the distance between an upper surface and a lower surface of the second lead 82, more specifically, the thickness of the thickest portion of the second lead 82.

First Lead and Second Lead

The first lead 81 and the second lead 82 are made of an electrically conductive material. The first lead 81 and the second lead 82 usually function as electrodes for supplying power to, for example, a light emitting element and a protective element, but the first lead 81 and the second lead 82 may not necessarily have to function as electrodes. That is, the first lead 81 or the second lead 82 may be a member that does not contribute to electrical conduction and, for example, the first lead 81 or the second lead 82 may be a heat releasing member. The light emitting device 100 may include three or more leads, and for example, the light emitting device 100 may include a third lead in addition to the first lead 81 and the second lead 82.

The first lead 81 and the second lead 82 each include an upper surface and a lower surface opposing the upper surface, and in the light emitting device 100 shown in FIGS. 1B and 1C, a lateral surface of the first lead 81 and a lateral surface of the second lead 82 face each other. The expression "the first lead 81 and the second lead 82 face each other" refers to not only a case in which an entirety of one lateral surface of the first lead 81 and an entirety of one lateral surface of the second lead 82 face each other, but also a case in which at least a portion of a surface of the first lead 81 and at least a portion of a surface of the second lead 82 face each other. A portion of the upper surface of each of the first lead 81 and the second lead 82 is located in the bottom surface of the recess 2, and the lower surface of each of the first lead 81 and the second lead 82 is exposed from the molded body 7. With such a configuration, even if heat is applied to the resin package 1 in a manufacturing process, the heat can be transferred from the lower surface of each of the first lead 81 and the second lead 82 to the outside. Accordingly, deformation of the first lead 81 and the second lead 82 due to heat can be reduced. In particular, a portion of the lower surface of each of the first lead 81 and the second lead 82 opposing a portion of the upper surface of each of the first lead 81 and the second lead 82 on which the light emitting element 3 is mounted is preferably exposed from the molded body 7. With such a configuration, heat from the light emitting element 3 can be efficiently transferred to the outside. Accordingly, for example, in the case where the light emitting element 3 is repeatedly turned on and off, expansion of the first lead 81 and the second lead 82 due to heat can more easily be reduced.

Each of the first lead 81 and the second lead 82 preferably includes a groove portion 6 in a region, covered with the side wall 4, of the upper surface of the lead. With the groove portion 6 as described above, even if soldering flux that has been melted by reflow operation enters a boundary between each of the first and second leads 81 and 82 exposed on a rear surface of the resin package 1 and the molded body 7 during mounting of the light emitting device 100 on a mounting substrate, the path of the soldering flux reaching into the recess can be increased. Accordingly, absorption of light from the light emitting element 3 by the soldering flux due to entry of the soldering flux can be reduced.

The first lead 81 and the second lead 82 each includes a base member and a plating layer that covers the base member.

Examples of the material of the base member include copper, aluminum, gold, silver, tungsten, iron, nickel, cobalt, molybdenum, alloys of these metals, phosphor bronze, and a copper-iron alloy. These materials may be used as a single layer or a layered structure (e.g., a clad material). In particular, for the material of the base member of each of the first lead 81 and the second lead 82, copper is preferably used.

Examples of a material of the plating layer include silver, aluminum, nickel, palladium, rhodium, gold, copper and alloys of these metals.

Molded Body

The molded body 7 fixes the first lead 81 and the second lead 82. The lateral walls 4 are portions of the molded body 7, and the molded body 7 and the side walls 4 are made of the same member and molded integrally. Meanwhile, the lateral walls 4 may be formed, on an upper surface of the resin package 1 including the molded body 7 and the first lead 81 and the second lead 82, by drawing a resin, subjecting a resin to compression molding or the like with a mold, or attaching a frame made of a metal, ceramics, glass epoxy, or the like and injecting a resin into the frame. For a base material of the molded body 7, for example, a thermosetting resin or a thermoplastic resin can be used. Specific examples of the resin include an epoxy resin composition, a silicone resin composition, and modified epoxy resin compositions such as a silicone-modified epoxy resin; modified silicone resin compositions such as an epoxy-modified silicone resin; and resins such as an unsaturated polyester resin, a saturated polyester resin, a polyimide resin composition, a modified polyimide resin composition, polyphthalamide (PPA), a polycarbonate resin, polyphenylenesulfide (PPS), a liquid crystal polymer (LCP), an ABS resin, a phenol resin, an acrylic resin, and a PBT resin. In particular, a thermosetting resin is preferable.

The molded body 7 preferably contains a light reflective substance, and examples of such a light reflective substance include titanium oxide, silicon oxide, zirconium oxide, potassium titanate, aluminum oxide, zinc oxide, aluminum nitride, boron nitride, and mullite. With the molded body 7 including such a light reflective substance, the light from the light emitting element 3 can be efficiently reflected. For example, in the case where titanium oxide is used, preferably 20 to 60% by weight, more preferably 25 to 55% by weight of titanium oxide are contained with respect to the total weight of the resin member. The molded body 7 preferably has a reflectance of 60% or more, more preferably 90% or more with respect to light from the light emitting element 3.

With the resin package 1 as described above, even if the first lead 81 and/or the second lead 82 is deformed by heat, the amount of the deformation can be relatively reduced.

Light Emitting Element

The light emitting element 3 includes a first electrode 101 and a second electrode 102, and the first electrode 101 and the second electrode 102 each includes a post electrode 5 with a thickness of 50 μm to 150 μm. More specifically, the light emitting element 3 includes, as shown in FIG. 2B, an insulating substrate 104, a semiconductor layered body 105, a full-surface electrode 106, a cover part 107, an insulating film 108, an n-side electrode 109, a p-side electrode 110, and the post electrodes 5. The semiconductor layered body 105 includes, from an insulating substrate 104 side, an n-type semiconductor layer, an active layer, and a p-type semiconductor layer in this order. Each of the full-surface electrodes 106 is disposed so as to cover a substantially entire surface of the upper surface of the p-type semiconductor layer. The full-surface electrodes 106 serve to diffuse current supplied via the p-side electrode 110 over the entire surface of the p-type semiconductor layer. The cover part 107 are each disposed so as to cover a part of the upper surface and lateral surfaces of each of the full-surface electrodes 106. The cover part 107 are disposed to prevent migration of a metal material contained in the full-surface electrode 106. The insulating film 108 is an interlayer insulating film that is provided on the semiconductor layered body 105 and functions as a protective film and an antistatic film for the light emitting element 3. The n-side electrode 109 and the p-side electrode 110 are pad electrodes of the light emitting element 3. Each of the post electrodes 5 is disposed on respective one of the n-side electrode 109 and the p-side electrode 110 and is conductive with respective one of the n-side electrode 109 and the p-side electrode 110. The post electrodes 5 also function as heat transfer paths for releasing heat emitted by the light emitting element 3. In FIG. 2B, illustration of the light emitting element 3 may be partially omitted for the sake of clarity in description of the members in the drawing. In a plan view, each of the post electrodes 5 may have any appropriate shape formed by combining a line and/or a curve. Further, each of the post electrode 5 preferably has a shape that is substantially the same in a thickness direction. With the post electrode 5 having such a shape, the heat emitted by the light emitting element 3 can be dissipated evenly from the post electrodes 5 toward the leads. Examples of the shape of each of the post electrodes 5 as described above include a circular column shape, a rectangular parallelepiped shape, and a hexagonal column shape.

For a material of each of the post electrodes 5 of the light emitting element 3, copper, silver, gold, platinum, or the like can be used. In particular, for the material of the post electrode 5 of each of the first electrode 101 and the second electrode 102, copper is preferably used. Using copper for the material of each of the post electrodes 5 allows for improving heat dissipation as compared with a case of using a material such as gold.

For each of the post electrodes 5, for example, a printed bump, a stud bump, and a plated bump that can be formed by electrolytic or electroless plating. In particular, a plated bump formed by electrolytic plating is preferably used. For example, each of the post electrodes 5 can be formed with a thickness of 50 μm to 150 μm by electrolytic copper plating. With such a copper-plated bump formed by plating, it is possible to provide a light emitting element with good heat dissipating property at low cost. The post electrodes 5 each have a thickness of preferably ¼ or more of the thickness of each of the first lead and the second lead. With the post electrodes 5 each having such a thickness, stress caused by heat can be effectively reduced by the post electrodes 5.

The first electrode 101 and the second electrode 102 of the light emitting element 3 are disposed to face the first lead 81 and the second lead 82, respectively. The light emitting element 3 is mounted across the first lead 81 and the second lead 82. In the light emitting device 100 illustrated in FIG. 1D, the first electrode 101 is disposed on a first lead 81 side, and the second electrode 102 is disposed on a second lead 82 side. With such a configuration, it is possible to omit a region for disposing wires, so that the size of the light emitting device can be reduced as compared with a case of a light emitting device in which a light emitting element is connected with wire.

Figure 2A:
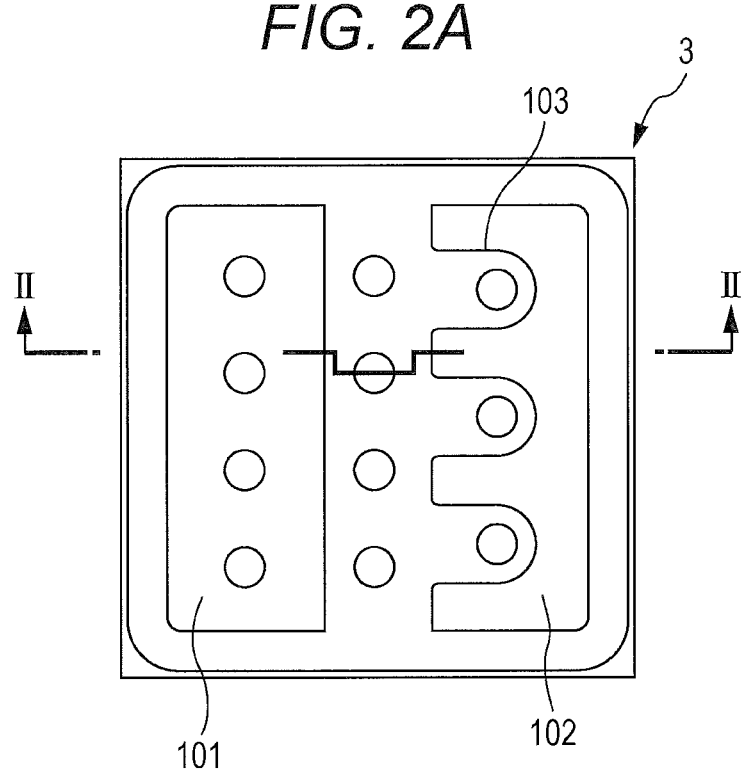
FIG. 2A is a schematic top view showing a light emitting element of the light emitting device according to the first embodiment of the present disclosure.
Figure 2B:
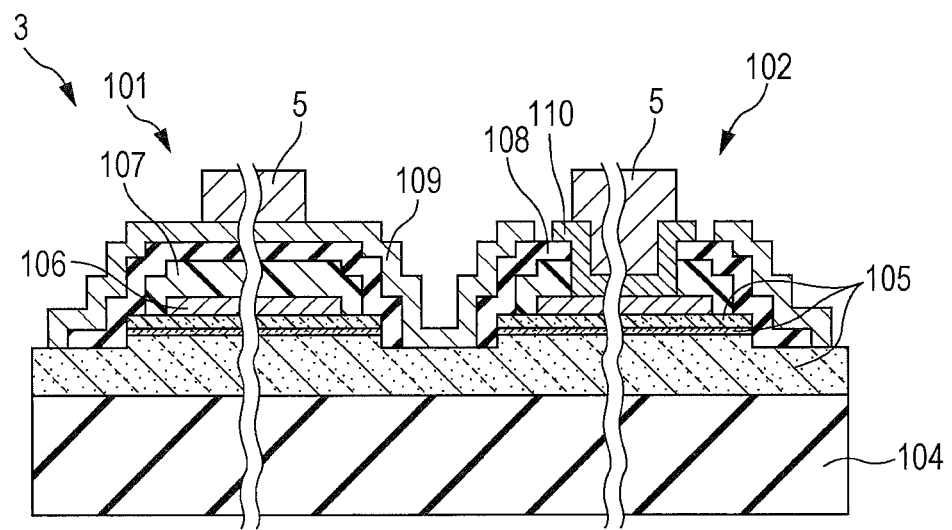
FIG. 2B is a schematic cross-sectional view taken along the line II-II in FIG. 2A.

In the light emitting element 3, in a plan view, the area of the first electrode 101 is preferably different from the area of the second electrode 102, as illustrated in FIG. 2A. In other words, the bonding area between the first lead 81 and the first electrode 101 that are bonded by the bonding member 111 described below is preferably different from the bonding area between the second lead 82 and the second electrode 102 that are bonded by the bonding member 112 described below. With such a configuration, when heat is applied to the resin package 1, stress applied on one side of the resin package 1 having a larger bonding area between the electrode and the lead can be transferred to the other side of the resin package 1 having a smaller bonding area between the electrode and the lead, and thus the stress can be reduced.

Examples of the method of providing the area of the first electrode 101 and the area of the second electrode 102 that are different from each other include formation of a recessed portion 103 in the second electrode 102 as illustrated in FIG. 2A. In FIG. 2A, in a periphery of the second electrode 102 facing the first electrode 101, recessed portions 103 are formed. With this arrangement, a periphery of the first electrode 101 at a side facing the second electrode 102 has a length different from a length of a periphery of the second electrode 102 at a side facing the first electrode 101. A periphery of the second electrode 102 in contact with the bonding member 112 has a length greater than the length of a periphery of the first electrode 101 in contact with the bonding member 111. The second electrode 102 has a bonding area for bonding with the first lead 81 that is smaller than the bonding area of the first electrode 101 for bonding with the second lead 82, which may lead to decrease in heat dissipation. However, increasing the length of the periphery of the second periphery of the second electrode 102 in contact with the bonding member 112 allows heat applied to the second electrode 102 to be transferred to the outside via the bonding member 112.

For the light emitting element 3, a semiconductor light emitting element such as a light emitting diode element can be employed. For the light emitting element 3, a light emitting element such as a nitride semiconductor ($In_xAl_yGa_{1-x-y}N$, $0 \le x$, $0 \le y$, $x+y \le 1$) configured to emit light in the ultraviolet region to visible light region. Further, three light emitting elements 3 configured to emit, for example, blue light, green light, and red light, or two light emitting elements 3 configured to emit blue light and green light may be mounted in one light emitting device.

Bonding Member

The first electrically conductive bonding member 111 bonds the light emitting element 3 with the first lead 81, and the second electrically conductive bonding member 112 bonds the light emitting element 3 with the second lead 82. The first bonding member 111 is disposed to be interposed at least between the first electrode 101 of the light emitting element 3 and the first lead 81 for bonding the light emitting element 3 with upper surface of the first lead 81. The second bonding member 112 is disposed to be interposed at least between the second electrode 102 of the light emitting element 3 and the second lead 82 for bonding the light emitting element 3 with upper surface of the second lead 82. For each of the bonding members 111, 112, a material that allows the light emitting element 3 to be electrically conducted with the first lead 81 and the second lead 82 is used. Examples of such a material include solders such as tin-bismuth-based solder, tin-copper-based solder, tin-silver-based solder, and gold-tin-based solder, electrically conductive paste made of silver, gold, palladium, or the like, and brazing materials such as a bump, an anisotropic conductive material, and a low melting temperature metal.

Among these, for the bonding member, a eutectic alloy is preferably used, and an alloy including gold and tin as main components is particularly preferable. For example, using a copper plating bump formed by plating for each of the post electrodes 5, and using an alloy including gold and tin as main components for the bonding member allows for reducing the difference between the linear expansion coefficient of the post electrodes 5 and the linear expansion coefficient of the bonding members 111, 112. With this arrangement, the bondability between each of the post electrode 5 and respective one of the bonding members 111, 112 can be improved, so that detachment of the light emitting element 3 can be further reduced.

Sealing Member

The light emitting device 100 preferably includes a sealing member 8. The sealing member 8 is disposed in the recess 2 to cover the light emitting element 3. The sealing member 8 protects the light emitting element from, for example, external force, dust, and moisture, and contributes to improve heat resistance, weather resistance, and light resistance of the light emitting element.

A portion of the sealing member 8 is preferably disposed between each of the first and second leads 81 and 82 and a lower surface of the light emitting element main body of the light emitting element 3. More preferably, a portion of the sealing member 8 fills the entirety of space between each of the first and second leads 81 and 82 and a lower surface of the light emitting element main body of the light emitting element 3. With such a configuration, the sealing member 8 can bond the light emitting element 3 with each of the first lead 81 and the second lead 82, so that detachment of the light emitting element 3 from the first lead 81 and the second lead 82 can be effectively prevented. For the sealing member 8, a resin having a low viscosity before curing is preferably used so that the sealing member 8 can be easily filled in the space between the light emitting element 3 and each of the first and second leads 81 and 82. The sealing member 8 is preferably a member less easily expands by heat, and preferably has a small linear expansion coefficient.

The sealing member 8 preferably transmits 60% or more, further preferably 70%, 80%, or 90% or more of the light emitted from the light emitting element 3. For the material of the sealing member 8, a resin material used for the molded body 7 can be used, and for the base material of the sealing member 8, for example, a silicone resin, an epoxy resin, an acrylic resin or a resin containing at least one of these resins can be used. The sealing member 8 can be made of a single layer, but may have a layered structure. In the sealing member 8, light scattering particles made of, for example, titanium oxide, silicon oxide, zirconium oxide, or aluminum oxide may be scattered.

In the sealing member 8, particles of a material (e.g., a fluorescent material) configured to convert a wavelength of light emitted from the light emitting element 3 may also be scattered. More specifically, examples of the fluorescent material include, yttrium-aluminum-garnet activated by cerium, lutetium-aluminum-garnet activated by cerium, nitrogen-containing calcium aluminosilicate activated by europium and/or chromium (a part of calcium can be substituted with a strontium), sialon activated by europium, silicate activated by europium, strontium aluminate activated by europium, and potassium fluorosilicate activated by manganese.

The content of the light scattering particles and/or the fluorescent material is preferably about 10 to 100% by weight with respect to the total weight of the sealing member 8, for example.

Protective Element

The light emitting device 100 preferably includes a protective element 10 to improve electrostatic discharge resistance. For the protective element 10, any appropriate known protective element mounted in the light emitting device may be used. For example, a Zener diode can be used for the protective element 10.

The protective element 10 is preferably enclosed in a lateral wall 4. With such a configuration, it is unnecessary to secure a region for mounting the protective element 10 and a region sufficient for bonding the wire to establish electrical connection with the protective element 10, so that increase in the size of the resin package 1 is not needed. Further, light of the light emitting element 3 can be prevented from being absorbed by the protective element 10, so that a compact light emitting device with good light extraction efficiency can be provided.

The protective element 10 is mounted on the upper surface of the first lead 81 or the upper surface of the second lead 82 in a region on which the lateral wall 4 is to be formed, before forming of the lateral walls 4. The protective element 10 can be electrically conducted with the first lead 81 or the second lead 82 by wire-bonding or flip-chip mounting via a bump.

Protective Film

The light emitting device 100 may include a protective film made of, for example, silicon oxide, on a surface of each of the first lead 81 and the second lead 82. When the plating layer made of silver is disposed at a surface of each the first lead 81 and the second lead 82, it is possible to reduce discoloration of the silver plating layer caused by, for example, a sulfur component in the air by protecting the surface of the silver plating layer by the protective film. For a method of forming the protective film, for example, a vacuum process such as sputtering, or other known methods can be employed.

Second Embodiment

Figure 3:
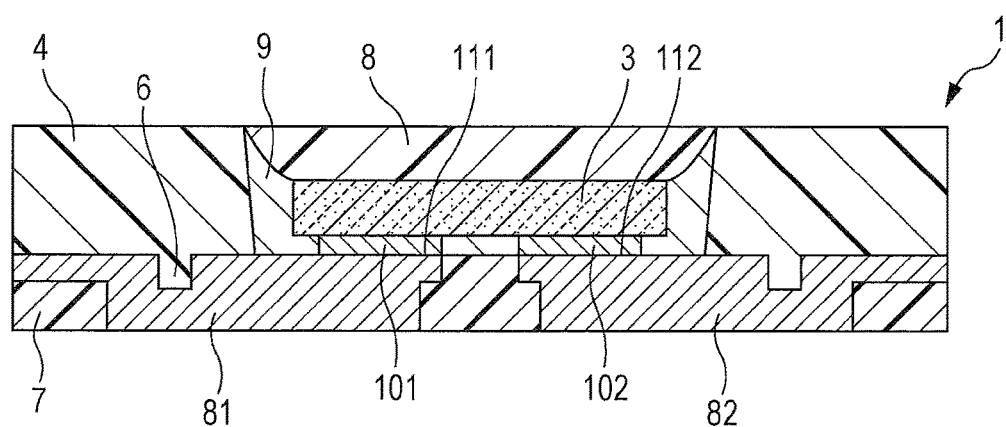
FIG. 3 is a schematic cross-sectional view of a light emitting device according to a second embodiment of the present disclosure.

FIG. 3 is a schematic cross-sectional view showing a light emitting device 200.

The light emitting device 200 includes a resin package 1 in which a molded body 7 is molded with a first lead 81 and a second lead 82, a light emitting element 3 mounted on the resin package 1, a light reflective member 9 that covers lateral surfaces of the light emitting element 3, and electrically conductive bonding members each electrically connects the light emitting element 3 to respective one of the first lead 81 and the second lead 82.

The light emitting device 200 is different from the light emitting device 100 in that the light emitting device 200 further includes the light reflective member 9 that covers the lateral surfaces of the light emitting element 3. The light reflective member 9 covers at least the lateral surfaces of the light emitting element 3. In the light emitting device 200 shown in FIG. 3, the light reflective member 9 covers a lower surface of the light emitting element main body of the light emitting element 3, lateral surfaces of each of the first electrode 101 and the second electrode 102, an upper surface of each of the first lead 81 and the second lead 82, which are located at a bottom surface of the recess 2, and an inner surface of each of lateral walls 4. With such a configuration, all light emitted from the light emitting element 3 can be reflected by the light reflective member 9, so that the light extraction efficiency of the light emitting device can be improved. With the light reflective member 9 covering lateral surfaces of the light emitting element 3, light from the light emitting element 3 can be controlled so as not to be extracted in an unintended direction. Further, with the light reflective member 9 filled in a space between the light emitting element 3 and each of the first and second leads 81 and 82, the bondability between the light emitting element 3 and each of the first and second leads 81 and 82 can be improved, so that detachment of the light emitting element 3 can be further prevented even when heat is applied to the light emitting device 200.

The light reflective member 9 preferably has a light reflectance higher than that of the molded body 7 and the lateral wall 4. In other words, the light reflective member 9 preferably contains a light reflective substance (e.g., titanium oxide) at an amount greater than an amount of a light reflective substance contained in the molded body 7 and the lateral walls 4. For example, the light reflective substance contained in the light reflective member 9 is preferably 1.5 times or more, preferably twice or more, more preferably 2.5 times or more the light reflective substances contained in the molded body 7 and the lateral walls 4. For example, the light reflective member 9 contains 40% by weight of titanium oxide.

The light reflective member 9 preferably has a light reflectance higher than a light reflectance of a plating layer (e.g., silver-plating layer) of the first lead 81 and the second lead 82. In this case, the phrase "light reflectance" refers to the average of light reflectivities with respect to all wavelengths of light emitted from the light emitting element 3, and the expression "the light reflective member 9 has a light reflectance higher than a light reflectance of a plating layer" refers to that the average value of the light reflectivities of the light reflective member 9 with respect to all wavelengths of light emitted from the light emitting element 3 is higher than the average value of the light reflectivities of the plating layers for all wavelengths of light emitted from the light emitting element 3.

In the case where the light emitting device 200 includes the protective element 10, the protective element 10 may be enclosed in a lateral wall 4 as in the light emitting device 100 of the first embodiment, while the protective element 10 may alternatively be mounted on a bottom surface of the recess 2 with the light reflective member 9 covering the protective element 10. With this arrangement, the protective element can be prevented from malfunctioning when external force is applied to the protective element during molding of, for example, the lateral walls 4. Further, with the light reflective member 9 covering the protective element 10, absorption of light from the light emitting element 3 by the protective element 10 can be reduced, so that a light emitting device with high light extraction efficiency can be obtained.

The light reflective member 9 is preferably a member that does not easily transmit or absorb light from the light emitting element 3 and external light. For a base material of the light reflective member 9, a thermosetting resin, a thermoplastic resin, or the like can be used, and more specific examples of such a base material include a phenol resin, an epoxy resin, a BT resin, PPA, and a silicone resin. In such a base material, light scattering particles such as a reflecting member (e.g., titanium oxide, silicon oxide, zirconium oxide, aluminum oxide, and aluminum nitride) can be scattered, which does not easily absorb light from the light emitting element 3 and has a refractive index greatly different from a refractive index of the base material, so that light can be efficiently reflected.

For the light reflective member 9, a resin that is less easily discolored by light or heat than the molded body 7 and the lateral walls 4. A portion in direct contact with light or heat from the light emitting element 3 is particularly easily discolored, and therefore, for example, surfaces of the molded body 7 and surfaces of the lateral walls 4 that are made of an epoxy resin, is preferably covered with the light reflective member 9 made of, for example, a silicone resin, which has discoloration resistance greater than that of the molded body 7 and the lateral walls 4.

As described above, the embodiments are illustrated. These descriptions, however, does not limit scope of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a resin package comprising:
      a molded body comprising:
         a front surface;
         a rear surface opposite to the front surface in a height direction along a height of the light emitting device;
         a recess provided in the molded body to extend from the front surface toward the rear surface, the recess having an opening on the front surface and a bottom opposite to the opening in the height direction; and
         an area of the front surface being 60% to 80% of a sum of the area of the front surface and an opening area of the opening of the front surface;
      a first lead provided on the rear surface to be the bottom of the recess; and
      a second lead provided on the rear surface to be the bottom of the recess; and
   a light emitting element having a light emitting surface and a mounting surface opposite to the light emitting surface in the height direction and provided on the bottom in the recess such that the mounting surface opposes the bottom, the light emitting element comprising:
      a first electrode provided on the mounting surface to be electrically connected to the first lead; and
      a second electrode provided on the mounting surface to be electrically connected to the second lead.

2. The light emitting device according to claim 1, wherein an outer periphery of the front surface has substantially a square shape.

3. The light emitting device according to claim 2,
   wherein the resin package has four lateral surfaces to define the outer periphery of the front surface,
   wherein at least one of the first lead and the second lead is exposed in each of the four lateral surfaces, and
   wherein each of the four lateral surfaces has a planar shape defined by the molded body and at least one of the first lead and the second lead.

4. The light emitting device according to claim 1,
   wherein the resin package has a package height in the height direction, and
   wherein the first lead and the second lead have a lead thickness in the height direction, the lead thickness being 30% to 40% of the package height.

5. The light emitting device according to claim 2, wherein the resin package has an additional recess provided on the front surface and adjacent to a corner of the outer periphery of the front surface.

6. The light emitting device according to claim 5, wherein the additional recess has a circular shape viewed in the height direction.

7. The light emitting device according to claim 2,
   wherein each of the first lead and the second lead has a lead top surface opposite to the rear surface in the height direction, and
   wherein each of the first lead and the second lead includes a groove provided on the lead top surface and overlapped with the front surface in the height direction.

8. The light emitting device according to claim 7,
   wherein an outer periphery of the front surface includes
      a first side,
      a second side opposite to the first side in a first lateral direction,
      a third side connecting the first side and the second side, and
      a fourth side connecting the first side and the second side opposite to the third side in a second lateral direction perpendicular to the first lateral direction,
   wherein the groove includes
      a first groove portion extending along the first side,
      a second groove portion extending along the third side or the fourth side, and
      a third groove portion extending along the fourth side.

9. The light emitting device according to claim 8,
   wherein the first groove portion has a first groove length along the first side,
   wherein the third groove portion has a third groove length along the fourth side, and
   wherein the first groove length is longer than the third groove length.

10. The light emitting device according to claim 9, further comprising:
    a protective element provided between the third groove portion of the first lead and the third groove portion of the second lead in the second lateral direction.

11. The light emitting device according to claim 1, further comprising:
    a protective element provided on one of the first lead and the second lead and between the front surface and the one of the first lead and the second lead in the height direction.

12. The light emitting device according to claim 1,
    wherein a first electrode has a first electrode area viewed in the height direction, and
    wherein a second electrode has a second electrode area which is viewed in the height direction and which is different from the first electrode area.

13. The light emitting device according to claim 1,
    wherein each of the first electrode and the second electrode has a conductive part having a thickness of 50 μm to 150 μm in the height direction, and
    wherein the conductive part defines an outermost surface of the each of the first electrode and the second electrode with respect to the mounting surface.

14. The light emitting device according to claim 1,
    wherein each of the first electrode and the second electrode has a conductive part made of copper, and wherein the conductive part defines an outermost surface of the each of the first electrode and the second electrode with respect to the mounting surface.

15. The light emitting device according to claim 13, wherein the conductive part is made of copper.

16. The light emitting device according to claim 2, wherein an outer periphery of the opening has substantially a square shape.

* * * * *